United States Patent [19]

Nouet

[11] 4,253,231

[45] Mar. 3, 1981

[54] METHOD OF MAKING AN INDUCTIVE CIRCUIT INCORPORATED IN A PLANAR CIRCUIT SUPPORT MEMBER

[75] Inventor: Christian Nouet, Ste. Genevieve des Bois, France

[73] Assignee: Compagnie Industrielle des Telecommunications Cit-Alcatel, Paris, France

[21] Appl. No.: 868,581

[22] Filed: Jan. 11, 1978

[30] Foreign Application Priority Data

Jan. 13, 1977 [FR] France .................................. 77 00852
Jan. 17, 1977 [FR] France .................................. 77 01249
Feb. 15, 1977 [FR] France .................................. 77 04189

[51] Int. Cl.³ ...................... H01F 41/14; H01F 41/04
[52] U.S. Cl. ..................................... 29/602 R; 29/832; 29/841; 335/203; 335/279; 336/200; 427/116; 427/96; 427/127
[58] Field of Search ................... 29/602 R, 605, 625, 29/626, 622, 832, 841; 335/187, 203, 279, 199; 336/200; 361/400–402; 427/96–99, 116, 127

[56] References Cited

U.S. PATENT DOCUMENTS

| 3,185,947 | 5/1965 | Freymodsson | 29/602 X |
| 3,372,358 | 5/1968 | Roy et al. | 336/200 |
| 3,564,708 | 2/1971 | Harris | 29/602 X |
| 3,992,691 | 11/1976 | Molthen | 336/200 |

FOREIGN PATENT DOCUMENTS

1426475 2/1976 United Kingdom .

OTHER PUBLICATIONS

IBM Tech. Dis. Bulletin, vol. 11, Jan. 1969, pp. 912–913.

Primary Examiner—Carl E. Hall
Attorney, Agent, or Firm—Sughrue, Rothwell, Mion, Zinn and Macpeak

[57] ABSTRACT

A planar support member for an electric circuit, e.g. a printed circuit board, wherein at least a region of the support member includes magnetic material through at least a part of its thickness. A magnetic circuit is made in this material by forming at least one opening through it. The support member is then coated with insulative material and conductor paths are made on both faces of the support member by conventional techniques for such members. These paths include a winding disposed around a core part of the magnetic circuit with alternate half turns being formed on opposite faces and interconnected by through plating. The inductive circuit thus formed may constitute an inductor, a transformer or a relay.

2 Claims, 26 Drawing Figures

FIG.1
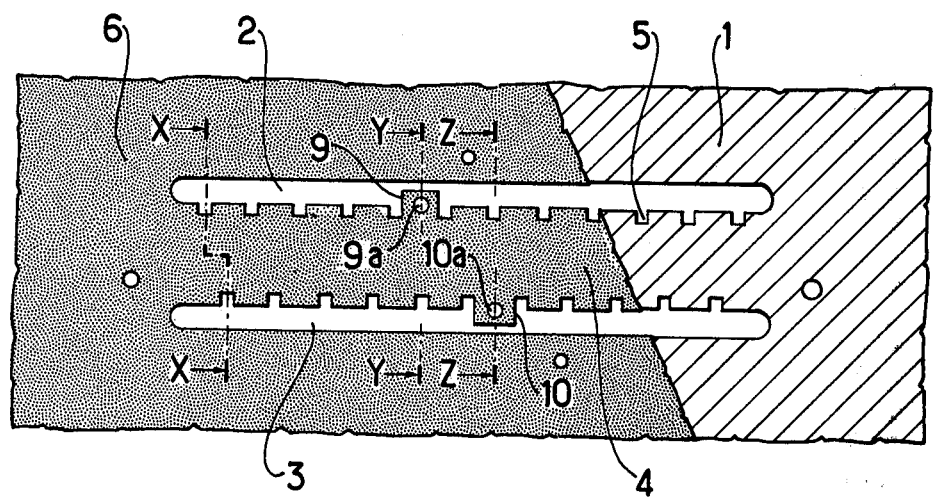
FIG.1a FIG.1b FIG.1c
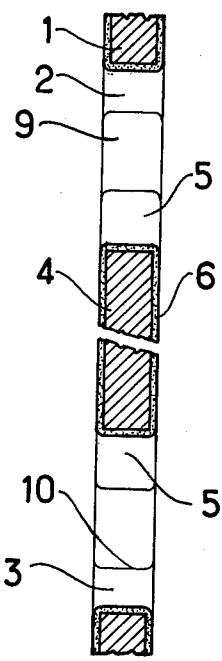
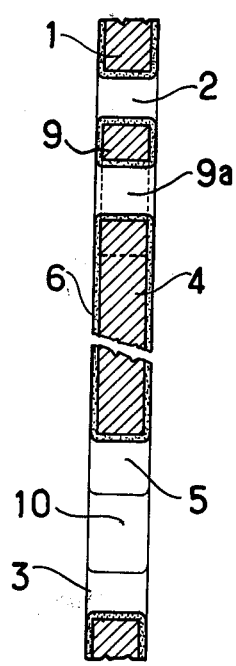
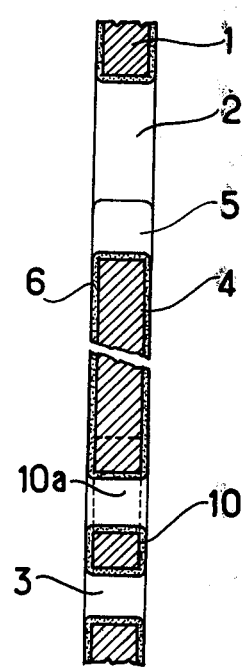

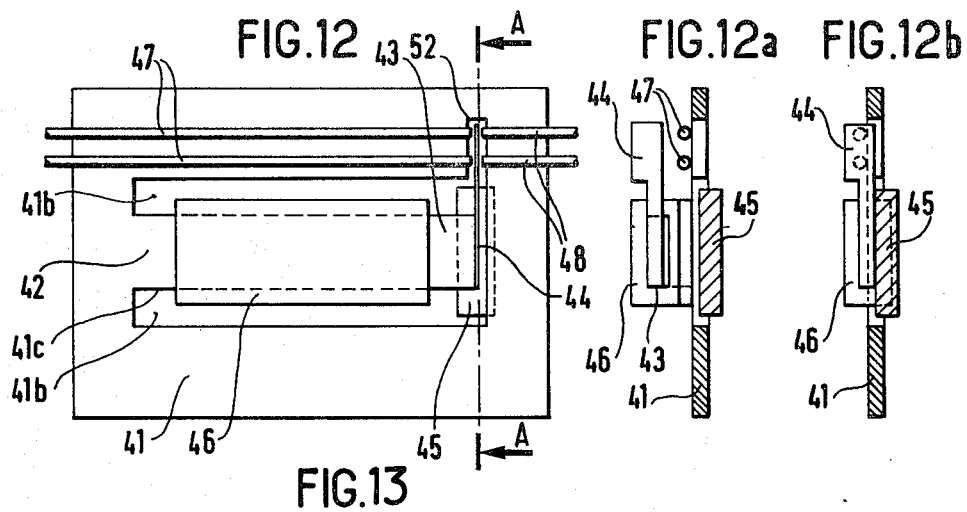
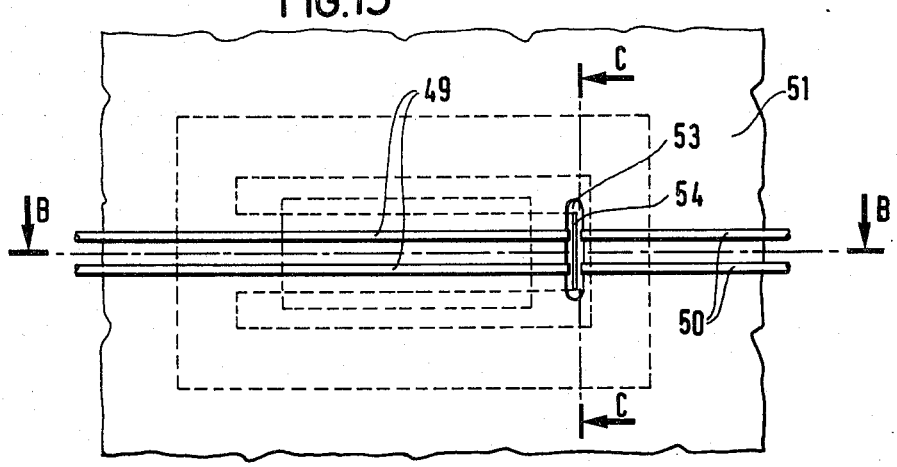
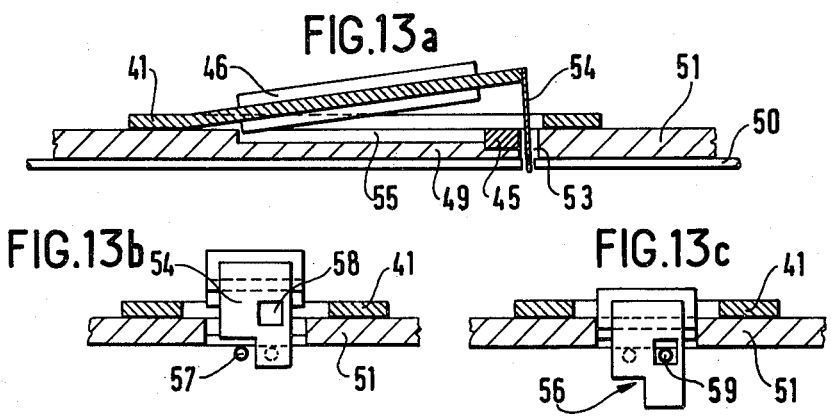

METHOD OF MAKING AN INDUCTIVE CIRCUIT INCORPORATED IN A PLANAR CIRCUIT SUPPORT MEMBER

FIELD OF THE INVENTION

The invention relates to a method for producing an inductive circuit incorporated in the support of an electric circuit, and includes the inductive circuit produced by application of said method.

The invention is equally applicable in printed circuit board (PCB) manufacture and in the production of integrated circuits and LSI (large scale integration) circuits.

BACKGROUND OF THE INVENTION

A means employed up to the present in producing inductors in thin-film circuits consists in using films comprising conductor tapes rolled in spirals and fixed to the surface of the circuit board. As a rule, the spiral covers a square area, for convenience in using the surfaces of the board. The value of these inductors is low, namely a few microHenrys, owing to the mediocre magnetic permeability of the surrounding zone (substrate and air).

Further, it has not yet been possible to incorporate into printed circuit boards, electronic devices employing transformers, such as stabilised power supplies, and such incorporation is of course even less feasible with integrated circuit supports. These transformers have therefore had to be provided as discrete units of by no means negligible bulk and weight, as compared with the degree of microminiaturization attained in printed and, even more so, in integrated circuit technology.

The purpose of the invention is the creation of inductive circuits, such as self-inductors, transformers, and relays, which are incorporated into the substrates of printed or integrated circuits.

SUMMARY OF THE INVENTION

The invention provides a method of manufacturing an inductive circuit which is incorporated in a planar support member for supporting an electric circuit, the method comprising the steps of:

providing a planar support member which includes at least a portion having magnetic material extending through at least a part of its thickness, said magnetic material and said support member having a configuration which forms a magnetic circuit including a magnetic core region with at least one opening adjacent to the magnetic core region;

coating at least the core region with a layer of insulative material; and forming conductor paths on both faces of said support member for interconnecting different components of an electric circuit to be supported by said support member, said conductor paths including a winding around said magnetic core region, the winding being electrically insulated from the magnetic material by the layer of insulative material, and the portions of the winding which are located on opposite faces of the magnetic core being interconnected via said opening.

Preferably the magnetic core region has notched edges with a conductive edge disposed around the base of each notch to interconnect portions of the winding disposed on opposite faces of the magnetic core. The notches on opposite sides of the core region may be staggered to define the pitch of the winding which zig zags from notch to notch across the core with alternate lengths being disposed on its opposite faces.

The inductive circuit may constitute such elements as a self inductor, a transformer or a relay.

For a transformer, two windings may be made in a single operation on different parts of the magnetic circuit or alternatively, a second layer of insulative material may be deposited on the first winding and a second winding may then be formed over the first. If the same notches are used to define the pitch of both windings, the turns ratio can differ from 1:1 by shorting together at least one pair of adjacent turns on one of the windings.

For most inductor or transformer applications the core region can have the shape of a strip with a longitudinal slot through the support member defining the side edges of the strip. However, for a non-saturable inductor or for a relay it is necessary to include an air-gap, preferably at one end of the strip. For a non-saturable inductor the air-gap can be a slot of width chosen with respect to the reluctance it will introduce in the magnetic circuit, while for a relay the air-gap slot itself should be narrow with the air-gap being increased by bending the core region, now in the form of a tongue, out of the plane of the support member. When current flows in the winding the tongue-shaped core returns to the plane of the support member and therefore acts as a relay armature. When the current stops flowing the core region will flex back to its out-of-plane position unless held e.g. by a permanent magnet, in which case an opposite direction flow of current would be necessary to release the relay armature.

The relay can be used to switch electrical signals by means of a further conductor disposed on the armature and having a contact for bridging the air gap or one of the slots when the relay is operated. Such a conductor can be applied to the armature by depositing a second layer of insulative material over the winding and then applying the conductor over this insulation.

The relay can also be used to switch light beams travelling in optical guides. To do this a gap is made in the optical guide and either a shutter is moved in and out of the path of the light beam by the armature or else a moving part of the guide itself is moved by the armature into and out of alignment with a fixed part of the optical guide.

Combined electronic/optical circuits can be mounted on the support member, with light emitting electronic components launching light beams into optical guides and photo-sensitive components receiving said beams when the switching is appropriate. A plurality of optical relays can be mounted in the same support member.

Embodiments of the invention are described by way of example with reference to the accompanying drawings.

BRIEF DESCRIPTION OF THE DRAWINGS

FIG. 1 is a plan view which, shows an example of the slotting of a PC or IC board shown as partially plastic-coated and partially bare, whether simultaneously or otherwise performed as the punching of holes for the mounting (of components) or interconnection of printed circuits (on both sides of the same board);

FIGS. 1a, 1b, and 1c, are cross-sections of the area containing the self-inductor, respectively along lines XX, YY, and ZZ of the board of FIG. 1, showing the plastic coating of the board;

FIG. 12 is a plan view of a relay in accordance with the invention with optical fibres disposed to one side of the relay armature;

FIGS. 12a and 12b are two transversal sections along the line A—A through the relay of FIG. 12 showing its non-operated and its operated positions respectively;

FIGS. 13 and 13A are respectively a plan view and a longitudinal section along a line BB of a second relay having optical fibres disposed centrally with respect to the armature;

FIGS. 13B and 13C are sectional views similar to FIGS. 12a and 12b showing the relay of FIG. 13 respectively in the non-operated and in the separated positions and demonstrating a particular form of the moving screen or shutter.

DESCRIPTION OF PREFERRED EMBODIMENTS

Figure 2:
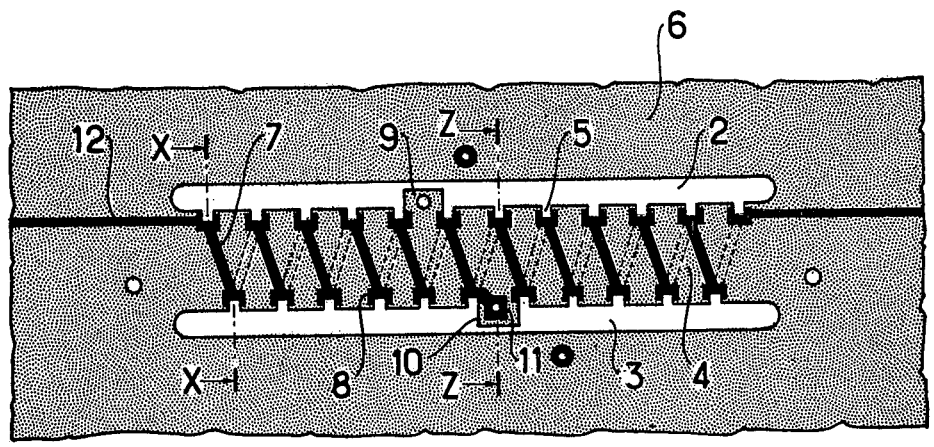
FIG. 2 is a plan view which shows either a self-inductor incorporated after first insulation coating, with second selective metallisation of the inter-slot area, or a ratio 1:1 transformer incorporated into the board.

The printed circuit board used in fabrication of the inductive circuits according to the invention is cut from an iron or magnetic alloy plate, of which a part 1 is shown marked in FIG. 1. Parallel slots 2 and 3 are produced in the board, the metal area between said slots constituting the magnetic core 4 of the inductive circuit to be formed. In practice, the cutting out and punching of the card, slots, and through-holes for interconnection of the circuits on each side, are all performed in a single operation.

The edges of the slots delimiting the magnetic core are preferably provided with notches 5. The surface of the board and the edges of slots 2 and 3 and notches 5 are covered with a thin layer of insulating material 6, such as by immersion of said board in a bath of liquid plastics material.

The spacing of the slots determines the pitch of the conductor turns 7 (FIG. 2), which are formed by the arrangement in parallel on each flat surface of the insulated magnetic core, of strips surrounding the outer edges of the notches, in such a way as to constitute an uninterrupted metal spiral 12 around said core.

When current flows in these turns, a magnetic flux is set up in the magnetic material zone surrounding the slots, said zone determining a magnetic circuit.

The turns may be produced as single-strand or multi-strand thin conductors, or as strips of metal in accordance with printed or integrated circuit techniques, or as strips added to the board, such as by gluing. FIG. 2 shows a self-inductive circuit incorporated into a supporting board, the latter being a printed circuit board, and the dotted lines in the figure showing the arrangement of the conductor track on the other side of the board.

The notches 5 are provided to prevent short-circuiting by bridging between consecutive turns where the conductor track goes around the edges of the slots defining the magnetic core. Each strip 7 interconnects corresponding slots on each flat side of the magnetic core, the ends of each turn comprising a conductive portion spread around each slot, so as to improve the conductive surface through the slot, and to increase coupling between turns.

Cutting out the magnetic core may provide intrusions into the width of the slots, such as 9,10 in FIG. 1, said intrusions possibly containing through-plated hole 9a, 10a, and a conductive land 11 (FIG. 2) connected to the edging 8 of a slot (FIG. 2), thereby forming intermediate taps in the inductive circuit.

Figure 3:
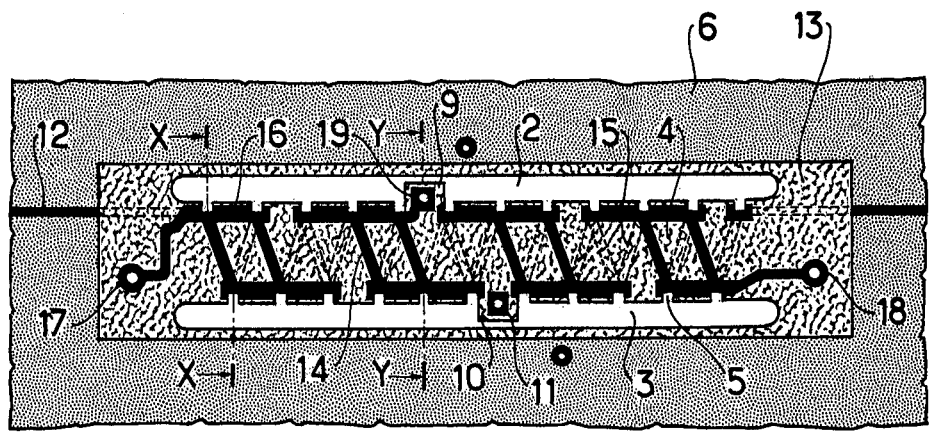
FIG. 3 is a plan view which represents an incorporated transformer with a ratio other than 1:1.

FIG. 3 shows a transformer of a ratio other than 1:1 produced on a printed circuit board, with its core incorporated into the board. The dotted lines indicate portions of the primary (or secondary) circuit of the transformer, said circuit being produced, for example, in the same form as the "helical" conductor 12 in FIG. 2. This circuit is covered by a second insulating layer 13, in the magnetic core and slot zone (second plastic coating of the core). The strips 14 represent the visible parts of the secondary (or primary) circuit of the transformer, and conductive strips 15, drawn in dotted lines, represent the hidden portions of said secondary (or primary) circuit on the other flat side of the magnetic core, after second plastic coating of said core. Strips 14 and 15 are, for example, printed circuits obtained by second plating of the second plastic coating 13.

The transformation ratio of other than 1:1 is obtained by means of bridging conductors 16, which short-circuit the ends of at least two neighbouring conductor strips, interconnecting the edges facing each other of the slots or notches on the same face of the magnetic core, said short-circuit increasing the conductive surface of the strips.

The bridges which are not connected to taps 17, 18 of the secondary (or primary) circuit of the transformer, are of double length, so as to provide conduction continuity between the strips on the front (or back) of the magnetic core, with those on the back (or front) of said core.

A conductive land such as 19 constitutes an intermediary transformer tap.

Figure 2A:
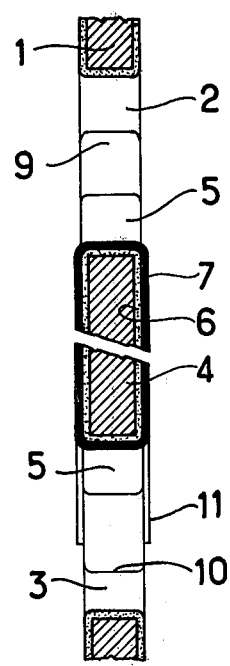
FIGS. 2a and 2b are cross-sections of the self-inductor area respectively along lines XX and ZZ of FIG. 2, showing the plastic coating of the board, the metal conductor circuit plating, and the plating of the hole.
Figure 3A:
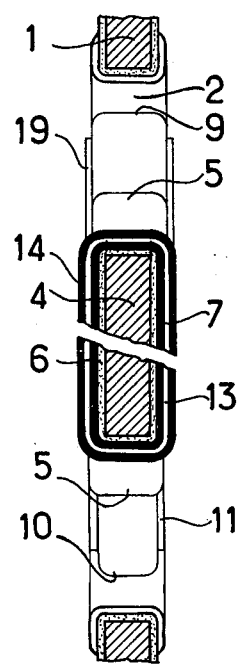
FIGS. 3a, and 3b are cross-sections of the self-inductor area, respectively along lines XX and YY of FIG. 3, showing double, alternate coating and plating of the area, and a double plastic-lined, through-plated hole.

FIGS. 1a, 2a, and 3a are cross-sections of the magnetic core 4 along lines XX in FIGS. 1, 2, and 3 respectively, to show the alternating layers of insulating and conductive material applied at various stages in fabrication of a self-inductive coil (FIGS. 1a and 2a), or of a transformer (FIG. 3a). FIGS. 2a and 3a follow the inductive winding for one complete turn.

Figure 3B:
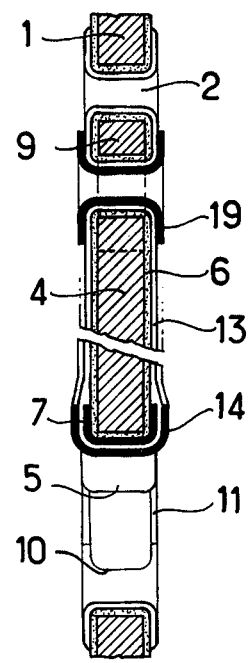

FIGS. 1b and 3b are cross-sections of the extension 9 of the magnetic core into slot 2, along line YY shown in FIGS. 1 and 3 respectively, and illustrating the phases of the fabrication of a through-plated hole with double insulation coating, such as that of intermediary tap 19 or taps 17 and 18 of the transformer.

Figure 2B:
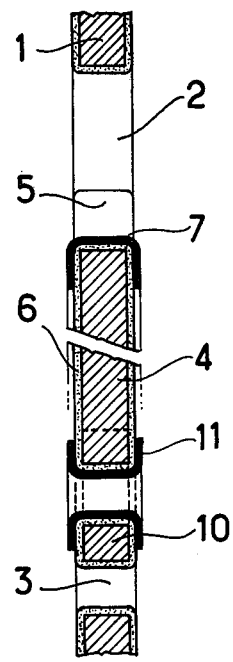

FIGS. 1c and 2b are cross-sections of the extension 10 of the magnetic core into slot 3, along lines ZZ shown in FIGS. 1 and 2 respectively, and illustrate the phases of the fabrication of a through-plated hole with a single insulation coating, such as that of intermediary tap 11 of the self-inductor.

The insulation coating of the faces of the board and of the edges of the holes and slots may be applied by several known processes, such as dipping, electrostatic sputtering, and electrophoresis.

The various stages of the fabrication of inductive circuits (self-inductors and transformers) are shown in FIGS. 4 to 9.

Figure 4:
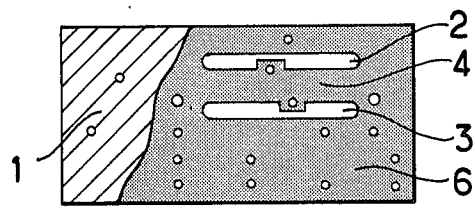
FIGS. 4 to 9 are plan views, in sequence, which show the various stages of the fabrication of a transformer incorporated into a printed or integrated circuit board.

FIG. 4 shows a board after punching (holes and slots) and first insulation coating. The slots are cut out with the holes in a single punching operation.

Figure 5:
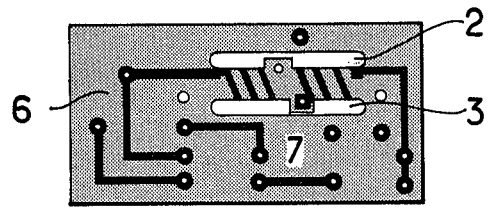

FIG. 5 shows a printed inductive circuit in accordance with the invention, and its connection to a conventional printed circuit. The two types of circuit ae produced at the same time in a first plating operation known as "photoselective" and which by known means produces a plating pattern directly on the plastic material, without using photoresist or silk-screen printing: only the insolated parts accept chemical deposition of copper (Photoforming-Photocircuit process, employing the direct action of light on certain metals in the presence of a photosensitiser; PDR process of the Philips company, employing the photochemical properties of certain oxides).

Figure 6:
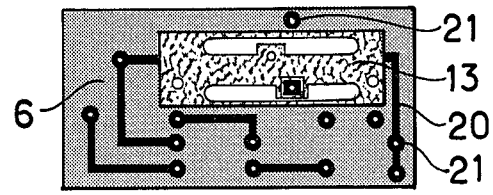

FIG. 6 shows a board which has received a second selective plastic coating in the magnetic core zone, that is to say, on the part intended to receive a second plating. This second plastic coating operation involves masking to prevent deposition of an insulating coat on conductors 20 and lands 21 of the conventional printed circuit.

Figure 7:
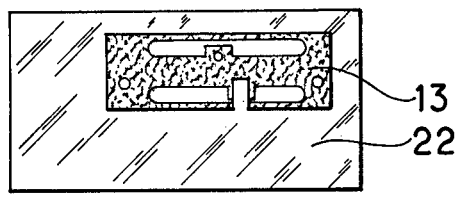
Figure 8:
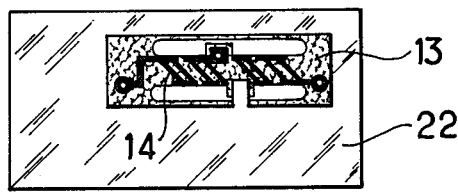

The lightly shaded area 22 in FIGS. 7 and 8 represents an anti-oxidizing protective coat. This coat is applied temporarily to all parts in which first-plating lands 21 are situated, for subsequent direct connection to components, thereby ensuring good solder-connection characteristics. The coating may be a photosensitive film applied hot by pressure.

FIG. 8 shows a board after second plating to produce the second coil (the primary or secondary) of the transformer. This figure shows a different number of turns in this second coil, as compared with the first, notwithstanding the fact that the same pattern could be used for the second as for the first.

Figure 9:
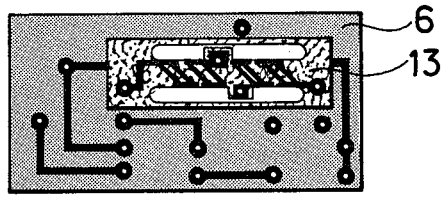

FIG. 9 shows a printed circuit board with incorporated transformer. The temporary protection has been removed to obtain the final pattern.

Figure 10:
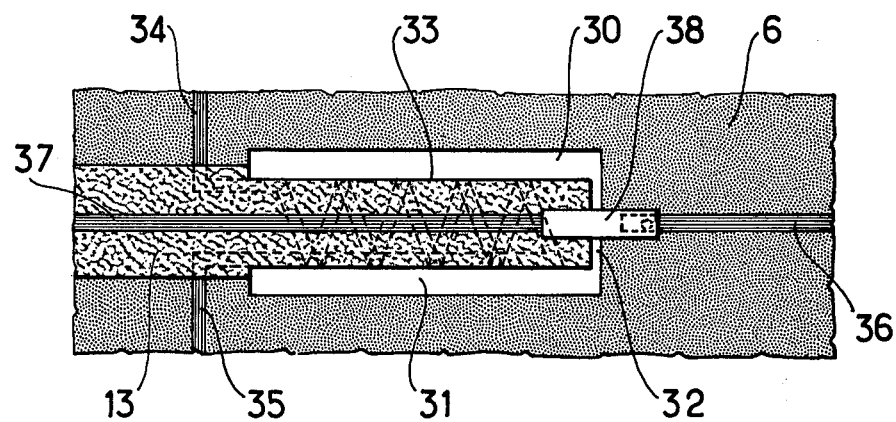
FIGS. 10 and 11 are plan and side views respectively which show a printed circuit switching relay.
Figure 11:

FIGS. 10 and 11 respectively show a plan and profile view of a printed circuit switching relay, of which the magnetic core is incorporated into the printed circuit board.

In a board of magnetic material, two parallel slots are cut, 30 and 31, which are joined by a narrower slot 32 normal to the same end of each of said slots. After first plastic coating 6, the inductive circuit shown in dotted lines is "printed" on the face and edges of strip 33 contained in said three slots, the ends 34 and 35 of said circuit being connected to terminals provided to receive energizing current. A conductor circuit 36 is also printed on the board beyond slot 32 and in line with the center-line of strip 33.

A second plastic coating 13 is then applied to one face of the strip and its extension on the board, and a conductor 37 is then applied by a second plating operation on said strip and its extension, on the center-line of the strip.

Strip 33 is then mechanically stressed at the end joining the rest of the board, so that it becomes oblique to the plane of the latter. A contact spring 38 fixed to the free end of strip 33 carries contact 39 at its free end.

When current flows between terminals 34 and 35 of the inductive circuit, the induced magnetic field brings the strip into alignment with the plane of the board, contact 39 therefore closing a continuous electrical path between conductors 36 and 37.

Strip 33 constitutes the armature of a relay incorporated into the board according to the invention, said armature also carrying the relay coil and functioning as the magnetic core.

An application of the invention to a relay for switching light beams conveyed by optical fibres will now be described. This application uses an opaque screen or shutter which is fixed to the relay armature and which is moved into or out of a gap in an optical fibre transmission path.

In both a first relay (FIG. 12) and a second relay (FIG. 13) in accordance with the invention, a rectangular magnetic circuit is made by cutting out a sheet of magnetic material. The cut out defines a central rectangular opening 41b of which the longest side defines a direction referred to here and in the following as longitudinal, and the shorter side defining a transverse direction. The plate around this opening forms the fixed yoke 41 of a relay. Part of the plate has been left in opening 41b to form a longitudinal strip 41c, which is part of yoke 1 at its end 41, and of which the front end is free and constitutes the moving armature 43 of the same relay, of which the controlling coil 46 is wound around the central portion of strip 41c. Said strip has been subjected to permanent distorsion, so that the armature 43 is distinctly above the plane of the yoke 1 when in the non-operated position, in the absence of magnetic attraction. Said attraction may be temporarily created by a positive current pulse through the coil 46, which then produces elastic bending at the rear part of strip 41c. The armature 43 is thus brought into its operated position, in the plane of 41, leaving a small air-gap between its front edge and the opposite edge of the yoke 41. The armature 43 is then held in its position by means of a permanent magnet 45 placed under the air-gap, and through which a holding magnetic flux is set up in the same direction as that created by the positive pulse through the coil 46. Return of the relay to its non-operated position, i.e. return of the flap into its non-operated position, is obtained when required by a negative current pulse applied to the coil 46, which creates a magnetic flux in the air-gap which is opposed to the holding flux.

Each switched optical guide is composed of two fibers 47 and 48 fixed to yoke 41 (FIG. 12) or 49 and 50, fixed under a magnetic support 51, on which the yoke 41 is also fixed (FIG. 13). The two fibers of each guide are produced by fixing two unbroken fibers by gluing or molding, for example, and then by cutting said fibers with a rotating diamond saw, or a laser beam.

The two ends of fiber thus cut are therefore in alignment.

A moving shutter 44, which is rigid and opaque, is fixed to the front edge of the armature 43 in such a way as to come between the opposite ends of the fibers 47 and 48, or 49 and 50.

If the optical guides are directly fixed on the yoke (FIG. 1), they are mounted on one or both longitudinal sides of said yoke said side or sides then including a slot provided to accept the shutter 44, which then extends laterally from and normal to the center-line of the armature.

When the relay is in the non-operated position, the shutter 44 is not between the fibers 47 and 48 (FIG. 12a), so that the light from (for example) the "up-circuit" fiber 47 can propagate into the "down-circuit" fiber 48.

When the relay is in the operated position, the shutter 44 comes between the fibers 47 and 48 (FIG. 12b), and the flow of light in the fiber 48 is interrupted.

If the optical guides such as 49 and 50 are fixed to a support such as 51, in the form of a non-magnetic plate carrying the magnetic circuit, the guides may be in the center-line of the armature (FIG. 13) and the shutter 54 need not extend laterally.

Such guides are mounted on the face opposite to that carrying the magnetic circuit.

The plate 51 has an opening 53 coinciding with the width of the shutter 54, so that the latter may come between the fibers such as 49 and 50 (FIG. 13a). Said plate also has a hollowed section 55 to receive the coil 46 when the relay is operated, and a seating for the permanent magnet 45.

The shutter 54 has a cut-away 56 leaving at least one fiber 57 unobstructed when the relay is in the non-operated position (FIG. 13b), said cut-away being in its lower left hand corner, for example, and a window in its upper right hand corner 58 leaving at least one other fiber 59 unobstructed when the relay is in the operated position.

It is possible, for example, to produce an optical switch possessing simultaneously the characteristics of both the forms described above, that is to say with optical guides on the magnetic circuit to one side of the armature, and with optical guides on the plate carrying the magnetic circuit and essentially along the center-line of the armature, the shutter then being provided with windows one above the other. The switching capacity of the device can moreover be increased by using optical guides in ribbons, or guides in ribbons stacked on tap of each other, and glued to the magnetic circuit.

It is moreover also possible to use the optical switching technology developed by the invention to create coded transmission devices employing binary or other codes, by using (for example) one optical switch per guide and per code element.

In another application of the invention to light guide switching, the light guides are stuck directly to the relay armature. A relay is made by cutting out a plate from a sheet of ferromagnetic material and comprises (FIG. 14) a yoke in the form of a band running round the four sides of a rectangle. An armature 63 is disposed inside the rectangle in parallel with its long sides. It is connected to the yoke at one end and its other end nearly reaches the opposite side of the yoke to leave a small air gap 68. The coil 65 of the relay is made from metal deposited directly on the armature. The armature is preformed so that its free end is slightly out of the plane of the yoke in the absence of magnetic attraction.

The relay is then held in the operated position by permanent magnet 68 and magnetised in parallel with the longer side of the rectangular yoke and placed opposite the end 63 of the armature and the air-gap. Operate and release signals for the relay are provided in the form of respectively positive and negative pulses of low power and short duration.

When the relay is operated, movement of the armature is limited by a stop 64 fixed to the yoke 11 and carrying the magnet 68. The function of this component is to ensure that the armature comes into an accurately determined position in relation to the yoke.

Figure 14:
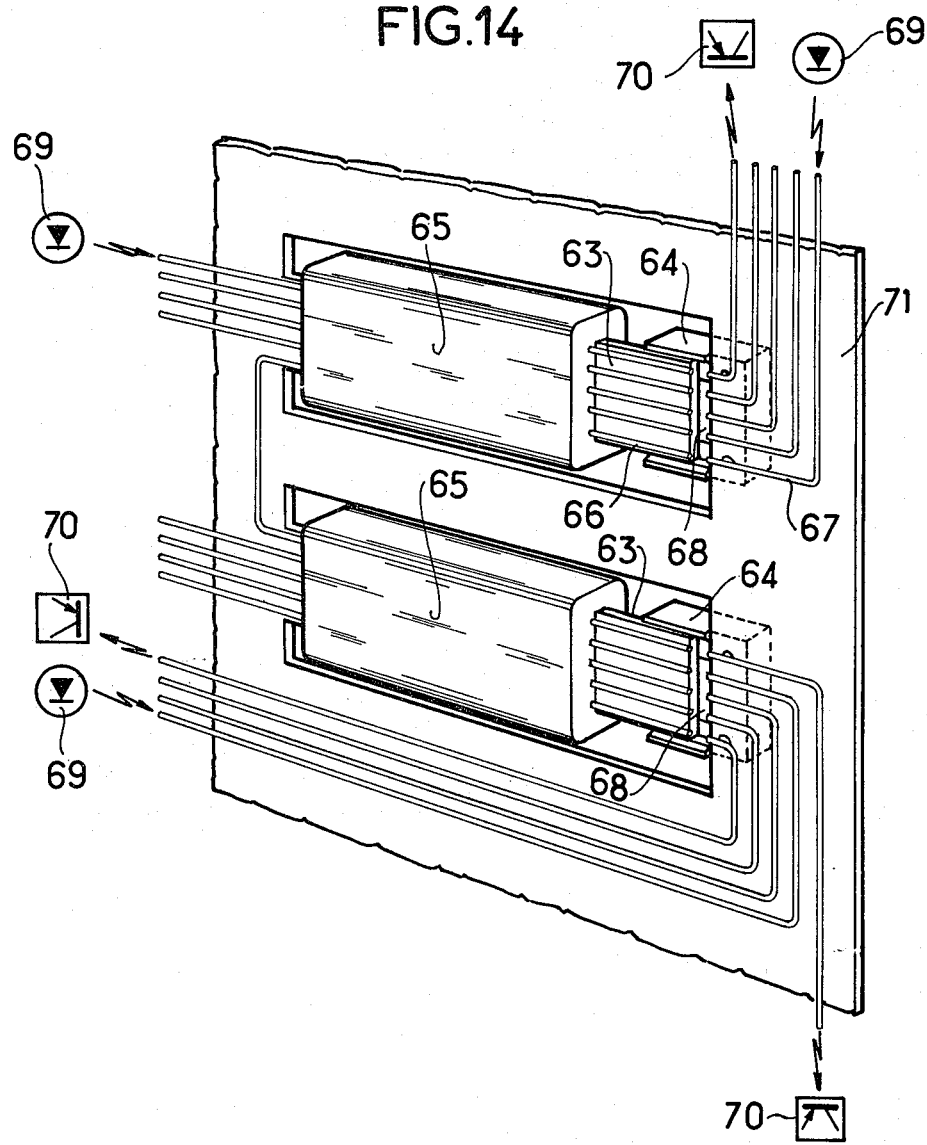
FIG. 14 is a perspective view which shows another application of the invention comprising several relays and several optical fibres.

As shown in FIG. 14, each optical guide comprises a moving upcircuit optical fiber and a fixed down-circuit optical fiber, composed respectively of parts 66 and 67 of one and the same fiber initially fixed both to the armature and to the yoke. Said single fiber was glued to the armature and the yoke with the relay in the operated position, and was then cut substantially in coincidence with the air-gap so that part 67 on the yoke is opposite the part 66 on the armature.

With the relay in the non-operated position, fibers 66 and 67 are no longer in alignment, so that the light from the up-circuit fiber 66, for example, is no longer transmitted to down-circuit fiber 67.

When the relay is operated, the two fibers come back into alignment. The space between the two facing ends being very small, for example less than 0.1 mm, the attenuation introduced by the switch is also very small.

A valuable application of the invention is the switching of analog electrical currents, particularly of high frequency currents. In said application, the incoming currents are received by optical electronic transmitters 69 such as light emitting diodes or semi-conductor lasers, which transform the currents into beams of modulated light at the inputs of optical guides. At the output end, receivers such as phototransistors, provide reverse conversion.

The device provides total electrical insulation between inputs and outputs, and there is no cross-talk between conductors.

A device as described is particularly suitable for the creation of complex circuits including a large number of connection points. It is then of advantage to provide direct connection between the fibers forming the various possible channels, and to use optical electronic converters at circuit inputs and outputs only. The joining of connection points as represented in FIG. 14 by arranging optical guides along paths involving bends of limited radius, for example 1 cm, is recognized practice.

Such a circuit may be mounted on a ferro-magnetic metal support.

It is in fact current practice to produce printed circuits on metal boards covered by a plastic coating, the circuits being formed on said coating. It is also possible to produce multi-layer circuits, using several plastic coats.

In the circuit shown in FIG. 14, the yokes and armatures of the various relays are formed by cutting a single metal plate in which spaces are provided for the coils and the air-gaps.

The optical guides may be glued to the supporting plate as desired, and as the guides are of small diameter, nothing opposes the mounting of guides in several layers.

Further, owing to their limited weight, such a relay armature can switch a large capacity group of optical guides.

Such a switch can also constitute a changeover switch, in which a fixed fiber of one or several guides may be substantially in parallel with second fixed fiber so that (for example) with the relay in the non-operated position a moring fiber faces the second fixed fiber, and with the relay operated, it faces the first fixed fiber. Evidently, the moving fibers may also be double.

The invention is of course not restricted to the forms described and shown, which are purely examples. In particular, it is possible to fabricate an incorporated transformer with a magnetic core, in accordance with the invention, by means of a single plastic coating followed by single plating of at least two self-inductor circuits side by side on the same magnetic core.

Also remaining within the scope of the invention, other means and techniques may be used to produce devices equivalent to those described, but conforming to another technology. For example, inductive circuits may be incorporated into printed circuit boards of the LSI class, by technical means producing results similar to those used in the case of printed circuit boards. Thus, punching of the slots forming the magnetic core may be replaced to advantage by the cutting of said slots with a Laser beam, thereby keeping within the microminiature scale proper to LSI circuit technology.

What is claimed is:

1. A method of manufacturing an inductive circuit which is incorporated in a planar support member for supporting an electric circuit, said method comprising the steps of:

providing a planar metallic support member which includes at least a portion having magnetic material extending through at least a part of its thickness, said magnetic material and said support member having a configuration which forms a magnetic circuit including a magnetic core region with at least one opening adjacent to the magnetic core region;

coating at least the core region with a layer of insulative material;

forming conductor paths on both faces of said support member for interconnecting different components of an electric circuit to be supported by said support member, said conductor paths including a winding extending around said magnetic core region, said winding being electrically insulated from the magnetic material by the layer of insulative material, and interconnecting the portions of the winding which are located on opposite faces of the magnetic core via said opening;

forming said magnetic core region in the form of a strip lying between two slots and interconnecting the two slots by a third slot so that the magnetic core region takes the form of a tongue surrounded on three sides by a single opening; and plastically deforming the tongue to adopt a position lying outside the plane of the magnetic circuit when unstressed to form the armature of a relay such that the tongue returns to said plane when magnetic flux flows through the magnetic circuit.

2. A method according to claim 1, including further steps of applying a second insulative coating to the tongue-shaped magnetic core followed by forming a conductor strip on said insulated core with said conductor strip bridging the opening around the tongue when the tongue is in the plane of the magnetic circuit to contact a conductor on the other side of the opening such that said contact is interrupted when the tongue adopts its position lying outside the said plane whereby the inductive circuit constitutes a switching relay incorporated in the support member.

* * * * *